US012660722B2

(12) United States Patent
Chi et al.

(10) Patent No.: US 12,660,722 B2
(45) Date of Patent: Jun. 16, 2026

(54) POWER MODULE PACKAGE WITH MOLDED VIA AND DUAL SIDE PRESS-FIT PIN

(71) Applicant: SEMICONDUCTOR COMPONENTS INDUSTRIES, LLC, Phoenix, AZ (US)

(72) Inventors: Heejo Chi, Yeoju-si (KR); Seungwon Im, Seoul (KR); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 742 days.

(21) Appl. No.: 18/056,442

(22) Filed: Nov. 17, 2022

(65) Prior Publication Data

US 2024/0170378 A1     May 23, 2024

(51) Int. Cl.
*H10W 74/01*          (2026.01)
*H10W 70/05*          (2026.01)
(Continued)

(52) U.S. Cl.
CPC ....... *H10W 90/701* (2026.01); *H10W 70/093* (2026.01); *H10W 70/095* (2026.01);
(Continued)

(58) Field of Classification Search
CPC .......... H01L 23/49811; H01L 21/4853; H01L 21/486; H01L 21/565; H01L 23/49822; H01L 23/49833; H01L 23/49861; H01L 24/32; H01L 24/48; H01L 24/73; H01L 2224/32225; H01L 2224/48011; H01L 2224/48091; H01L 2224/48095; H01L 2224/48175; H01L 2224/48225; H01L 2924/13055; H01L 2924/13091; H01L 2924/1815; H01L 2924/182; H01L 2924/183; H01L 2924/186; H01L 23/49562; H01L 23/5385; H01L 23/3735; (Continued)

(56) References Cited

U.S. PATENT DOCUMENTS

| 2009/0146272 A1 | 6/2009 | Wieneke Kessler et al. |
| 2010/0133667 A1 | 6/2010 | Oka et al. |

(Continued)

FOREIGN PATENT DOCUMENTS

| JP | 2011187819 A | 9/2011 |
| JP | 2013152966 A | 8/2013 |

OTHER PUBLICATIONS

International Search Report and Written Opinion for counterpart International Application No. PCT/US2023/076968, mailed Feb. 1, 2024, 16 pages.

*Primary Examiner* — Elias Ullah
(74) *Attorney, Agent, or Firm* — Brake Hughes Bellermann LLP

(57)          ABSTRACT
A module includes an assembly of a semiconductor device die, a lead frame connected to the semiconductor device die, and a substrate connected to the lead frame. The substrate includes at least one plated-through hole (PTH). A mold body encapsulates the assembly. The mold body includes a through-mold via (TMV) aligned with a portion of the substrate including the at least one PTH. The PTH is exposed in the TMV to an environment outside the mold body and is physically accessible from outside the mold body through the TMV.

21 Claims, 12 Drawing Sheets

(51) Int. Cl.

| | |
|---|---|
| *H10W 70/40* | (2026.01) |
| *H10W 70/685* | (2026.01) |
| *H10W 72/00* | (2026.01) |
| *H10W 72/50* | (2026.01) |
| *H10W 90/00* | (2026.01) |
| H10W 74/00 | (2026.01) |
| H10W 74/10 | (2026.01) |
| H10W 74/40 | (2026.01) |

(52) U.S. Cl.

CPC ........ *H10W 70/479* (2026.01); *H10W 70/685* (2026.01); *H10W 72/521* (2026.01); *H10W 72/851* (2026.01); *H10W 74/016* (2026.01); *H10W 90/401* (2026.01); *H10W 72/07552* (2026.01); *H10W 72/5366* (2026.01); *H10W 74/00* (2026.01); *H10W 74/10* (2026.01); *H10W 74/127* (2026.01); *H10W 74/40* (2026.01); *H10W 90/734* (2026.01); *H10W 90/754* (2026.01); *H10W 90/755* (2026.01)

(58) Field of Classification Search

CPC ........... H01L 23/49517; H01L 23/3107; H01L 23/49531

See application file for complete search history.

(56) References Cited

U.S. PATENT DOCUMENTS

| | | |
|---|---|---|
| 2014/0091683 A1 | 4/2014 | Ito et al. |
| 2015/0380274 A1 | 12/2015 | Yoshimatsu |
| 2020/0303215 A1 | 9/2020 | Ichikawa |

177

170

175

170

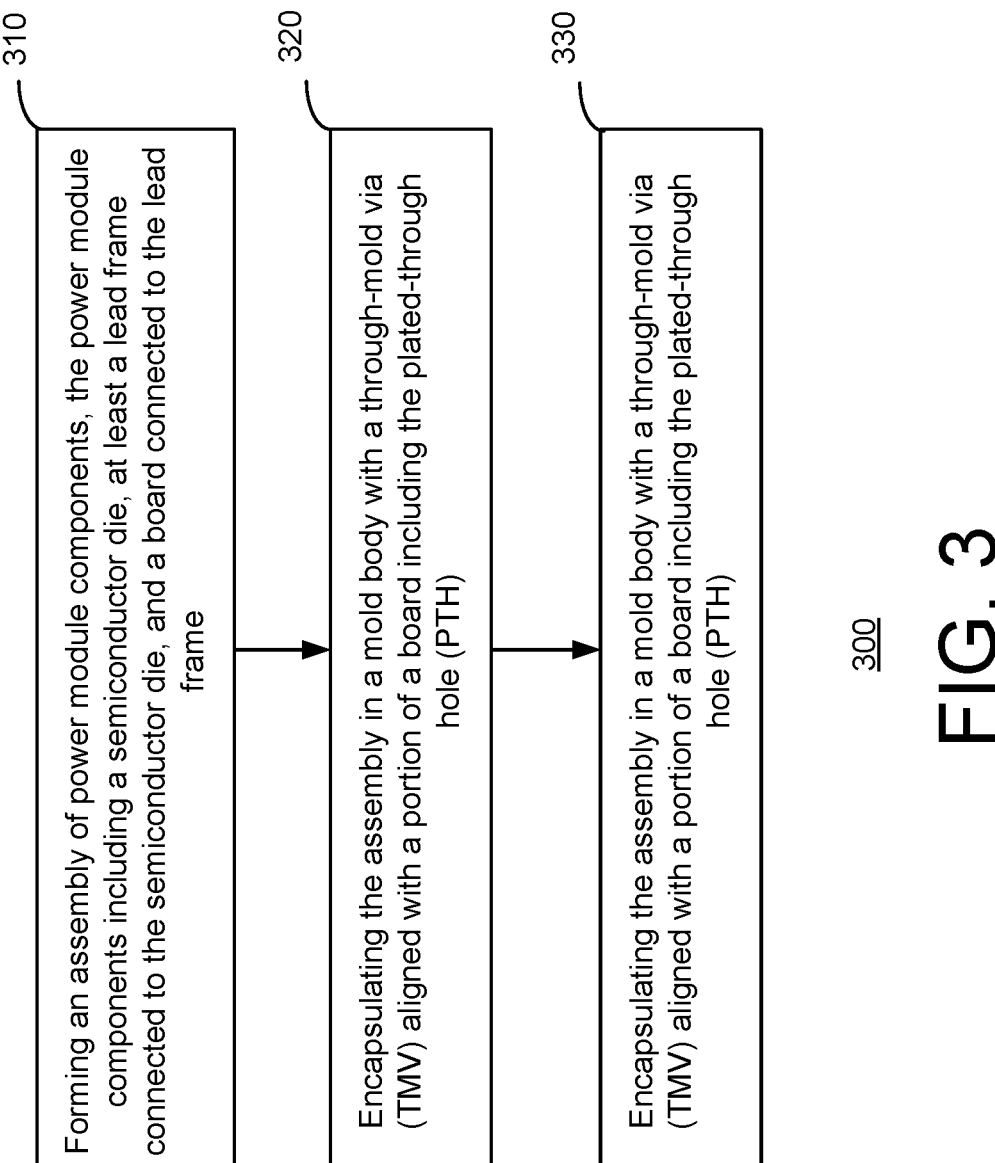

310

Forming an assembly of power module components, the power module components including a semiconductor die, at least a lead frame connected to the semiconductor die, and a board connected to the lead frame

320

Encapsulating the assembly in a mold body with a through-mold via (TMV) aligned with a portion of a board including the plated-through hole (PTH)

330

Encapsulating the assembly in a mold body with a through-mold via (TMV) aligned with a portion of a board including the plated-through hole (PTH)

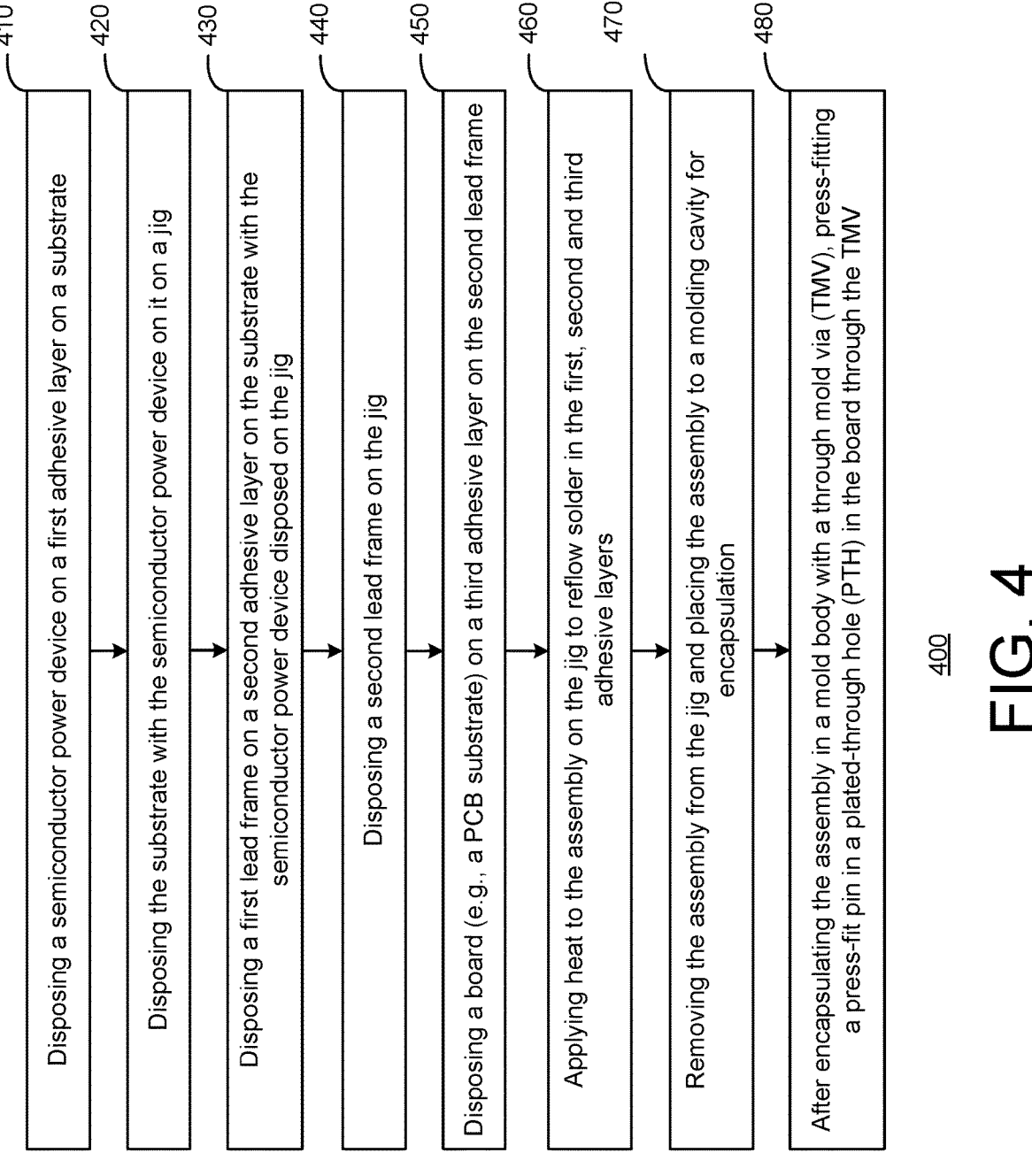

Disposing a semiconductor power device on a first adhesive layer on a substrate — 410

Disposing the substrate with the semiconductor power device on it on a jig — 420

Disposing a first lead frame on a second adhesive layer on the substrate with the semiconductor power device disposed on the jig — 430

Disposing a second lead frame on the jig — 440

Disposing a board (e.g., a PCB substrate) on a third adhesive layer on the second lead frame — 450

Applying heat to the assembly on the jig to reflow solder in the first, second and third adhesive layers — 460

Removing the assembly from the jig and placing the assembly to a molding cavity for encapsulation — 470

After encapsulating the assembly in a mold body with a through mold via (TMV), press-fitting a press-fit pin in a plated-through hole (PTH) in the board through the TMV — 480

POWER MODULE PACKAGE WITH MOLDED VIA AND DUAL SIDE PRESS-FIT PIN

TECHNICAL FIELD

This description relates to power devices and circuits. More specifically, this disclosure relates to power device modules or packages.

BACKGROUND

Power device packages are used in many power electronics circuits (e.g., power electronics circuits for home appliances, the automotive industry, and other industrial applications). An example power device package can include one or more semiconductor device die encapsulated in mold material within a housing. The semiconductor device die can be electrically coupled to lead frames that form the external power terminals of the power device package. The power device package may also include a set of signal leads and a set of power leads extending from the housing. The set of signal leads and the set of power leads extending from the housing may be soldered to, or coupled using press-fit pins to, an external substrate (e.g., a printed circuit board (PCB) of a host power electronics circuit.

SUMMARY

In a general aspect, a module includes an assembly of a semiconductor device die, a lead frame connected to the semiconductor device die, and a substrate connected to the lead frame. The substrate includes at least one plated-through hole (PTH). A mold body encapsulates the assembly. The mold body includes a through-mold via (TMV) aligned with a portion of the substrate including the at least one PTH. The PTH is exposed in the TMV to an environment outside the mold body and is physically accessible from outside the mold body through the TMV.

In a general aspect, a module includes a power device encapsulated in a mold body, and a press-fit pin coupler disposed outside the mold body. The press-fit pin coupler is electrically connected to the power device encapsulated in the mold body.

In a general aspect a method includes forming an assembly including a semiconductor device die, at least a lead frame connected to the semiconductor device die, and a substrate connected to the lead frame. The substrate includes at least one plated-through hole (PTH). The method further includes encapsulating the assembly in a mold body with a through-mold via (TMV) aligned with a portion of the substrate including the at least one plated-through hole (PTH). The PTH is exposed in the TMV to an environment outside the mold body and is physically accessible from outside the mold body through the TMV.

BRIEF DESCRIPTION OF THE DRAWINGS

FIG. 3 illustrates an example method for assembling a power module with a press-fit pin as an external signal or power lead.

FIG. 4 illustrates an example method for assembling a power module with a press-fit pin as an external signal or power lead.

Figure 1A:
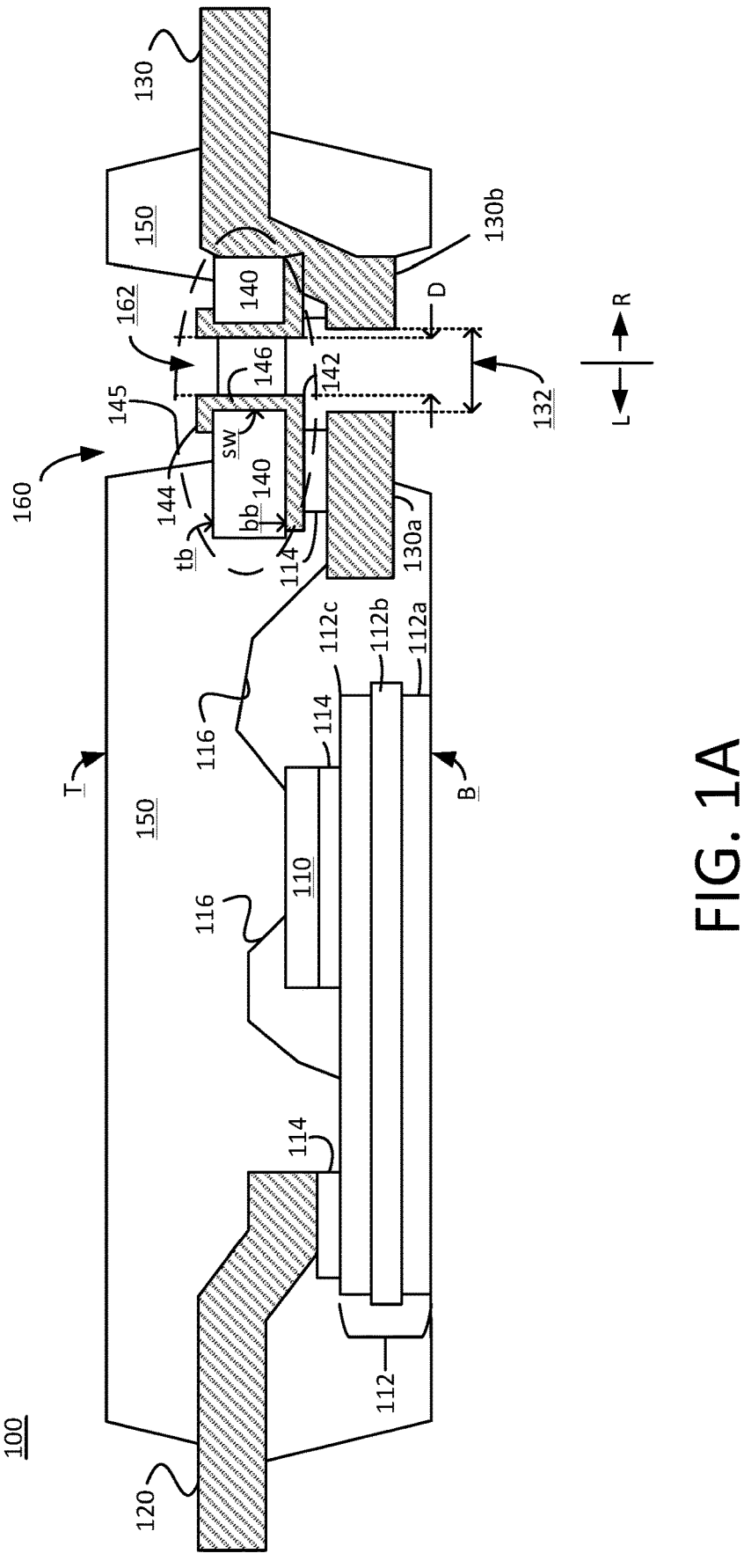
FIG. 1A illustrates, in a cross-sectional view, a power module including a press-fit pin coupler.

In the drawings, which are not necessarily drawn to scale, like reference symbols may indicate like and/or similar components (elements, structures, etc.) in different views. The drawings illustrate, by way of example, but not by way of limitation, various implementations discussed in the present disclosure. Reference symbols shown in one drawing may not be repeated for the same, and/or similar elements in the same view, or in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated in a given view.

DETAILED DESCRIPTION

With newer electronic applications (e.g., automotive, or other applications) there can be increasing performance requirements (e.g., size, electrical, thermal, mechanical, reliability and fatigue, external connections, and assembly requirements) on a power modules used to supply power to host electronic applications.

The present disclosure describes a power module that includes a press-fit pin coupler or connector within the power module. The power module may include at least one power device die (e.g., an insulated-gate bipolar transistor (IGBT), a power metal-oxide-semiconductor field-effect transistor (MOSFET), etc.) encapsulated in a housing or body made of a molding material (e.g., epoxy molding compound (EMC)). The power device die may be electrically connected to a leadframe that extends through the mold body to the outside of the housing to form, for example, an external power terminal or external ground terminal of the power module.

The press-fit pin coupler or connector (hereinafter press-fit pin coupler) is disposed in, or across, an opening in the mold body (e.g., across a through mold via (TMV) in the mold body). The press-fit pin coupler can include a press-fit pin receiver hole configured to receive an end of at least a press-fit pin through the opening (TMV) in the mold body and to electrically connect the press-fit pin to the power device die. The press-fit pin receiver hole is not covered by mold material but is exposed to the environment outside the mold body in the TMV and is physically accessible from outside the mold body freely through the TMV. The press-fit pin may form, for example, a signal lead, a power lead, or other connection terminal (e.g., a motor connection terminal) of the power module.

The press-fit pin may, for example, include a shaft (e.g., a cylindrical shaft) with a first end. The first end may have dimensions that are the same as, or larger than, the dimensions of the press-fit pin receiver hole to cause a friction fit or an interference fit when the first end of the press-fit pin is inserted in the hole. In some implementations, the press-fit pin may be a double-sided press-fit pin with a first end and a second end. The first end can be received in the press-fit pin coupler of the power module to electrically connect the press-fit pin to the power device die and the second end can used to connect the power module to (or to mount the power module on) a substrate (e.g., a printed circuit board) of a host electronics application (e.g., an automotive circuit application).

The use of the press-fit pins with the press-fit pin coupler can enable reliable, solder-less mounting of the power module on the substrate of the host electronics application while reducing, for example, a risk of stress-induced mechanical damage (e.g., cracking) of the epoxy molding compound used to encapsulate the semiconductor device dies in the power module.

In example implementations, the press-fit pin coupler may be a resilient substrate or board (e.g., a printed circuit board) with at least one plated-through hole (PTH) through it. The at least one plated-through hole (PTH) can be adapted to receive a press-fit pin to establish electrical connection with a lead frame in the power module. The insertion (or withdrawal) of the press-fit pin in the PTH can cause mechanical stress (insertion stress). The resilience of the substrate or board may help prevent or reduce propagation of the pin-insertion induced stress through the mold body of the power module and thus reduce the risk of cracks or other damage to the mold body of the power module.

Figure 1B:
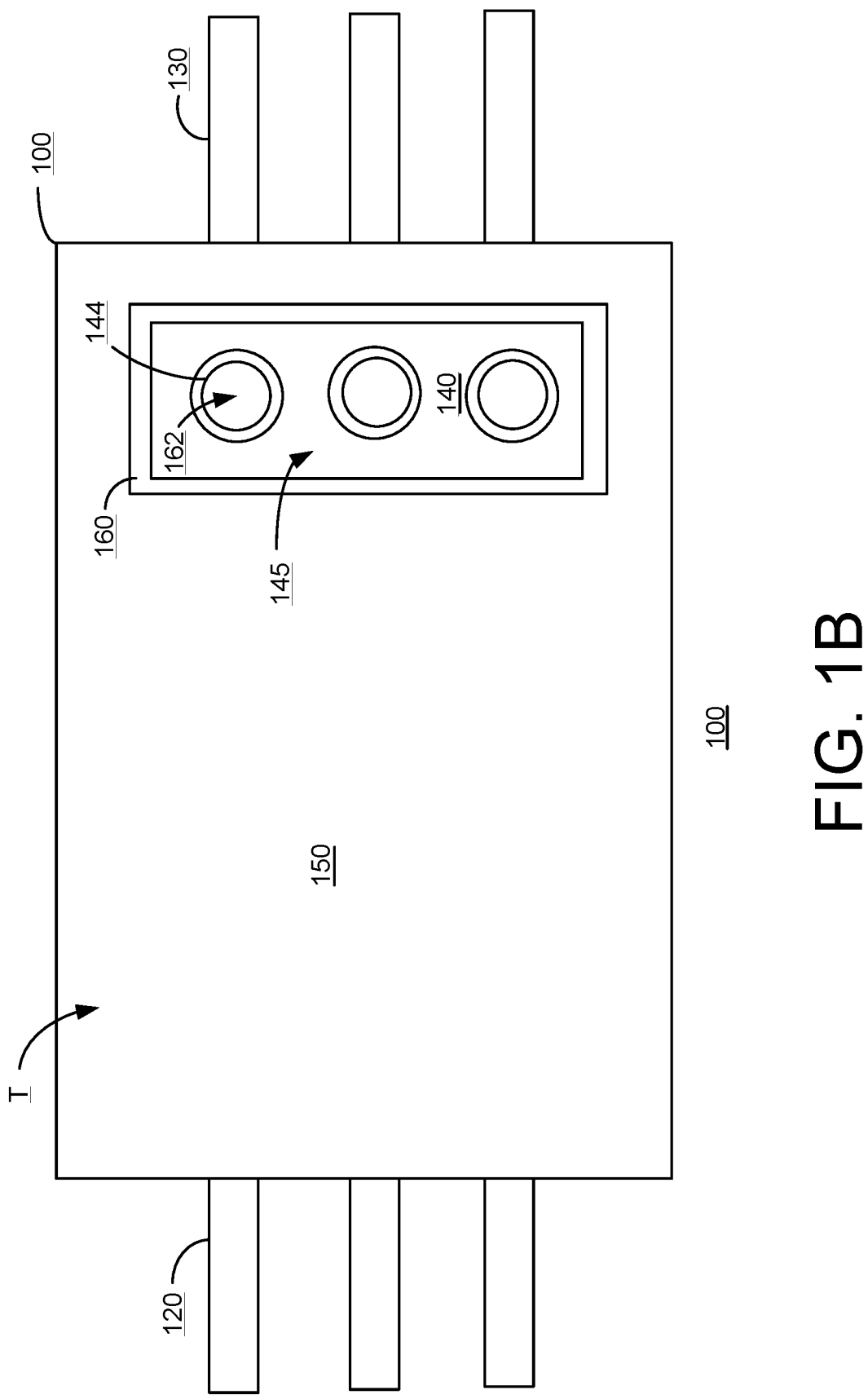
FIG. 1B illustrates, in a top view, the power module of FIG. 1A.
Figure 1C:
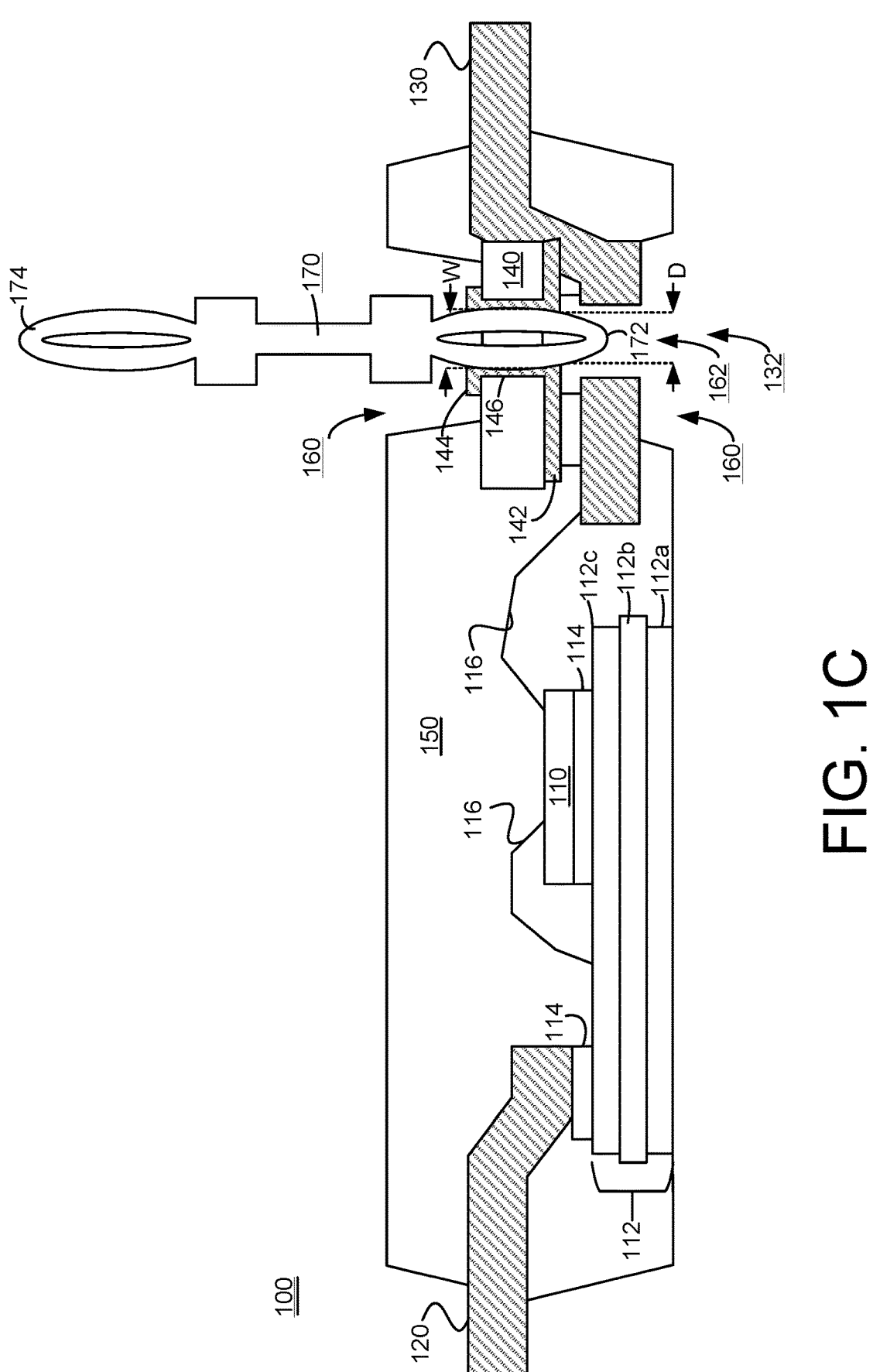
FIG. 1C illustrates, in a cross-sectional view, the power module of FIG. 1A with a press-fit pin inserted in the press-fit pin coupler.

FIG. 1A and FIG. 1B show a cross-sectional view and a top view, respectively, of an example power module 100 that includes a press-fit pin coupler 145, in accordance with the principles of the present disclosure. FIG. 1C show of cross-sectional view of power module 100 with a press-fit pin (e.g., press-fit pin 170) inserted in press-fit pin coupler 145.

Power module 100 may include, for example, at least a semiconductor device die 110 encapsulated in a mold body 150. Power module 100 may further include, for example, at least a pair of lead frames (e.g., lead frame 120 and lead frame 130) that can be connected to semiconductor device die 110 and extend out of the mold body as external terminals of the power module 100. Lead frame 130 may include for example, two portions (e.g., lead frame portion 130a and lead frame portion 130b) that are separated by a through mold via (TMV) (e.g., TMV 160). TMV 160 may, for example, extend from a top surface T to a bottom surface B of mold body 150.

In example implementations, semiconductor device die 110 (e.g., a power device) may be disposed on a substrate 112 (e.g., a double-bonded metal (DBM) substrate). Substrate 112 may, for example, include a thermally conductive ceramic tile 112b disposed between electrically conductive layer 112c and electrically conductive layer 112a (e.g., metal layers). Semiconductor device die 100 and lead frame 120 may be attached to electrically conductive layer 112c by adhesive layers (e.g., a first adhesive layer 114 and a second adhesive layer 114, respectively) (e.g., a solder or a conductive epoxy). Further, wire bonds (e.g., wire bond 116) may connect semiconductor device die 100 to electrically conductive layer 112c and to a discontinuous portion (e.g., lead frame portion 130a) of lead frame 130.

As shown, for example, in FIGS. 1A, 1B and 1C, press-fit pin coupler 145 may be disposed across TMV 160. Press-fit pin coupler 145 may include a resilient substrate or board (e.g., a printed circuit board) (e.g., board 140) with at least one plated-through hole (PTH) (e.g., hole 162) through it. Hole 162 may, for example, have a diameter D. The PTH (e.g., hole 162) is not covered by mold material, but is exposed to the environment (ambient) outside the mold body in TMV 160 and is physically accessible from outside the mold body through the TMV. The at least one plated-through hole (PTH) (e.g., hole 162) can be adapted to receive a press-fit pin (e.g., press-fit pin 170, FIG. 1C). The press-fit pin may form, for example, a signal lead, a power lead, or other connection terminal (e.g., a motor connection terminal) of the power module.

In example implementations, press-fit pin coupler 145/board 140 may be a flat laminated composite made from non-conductive substrate materials (e.g., fiberglass, plastic, or epoxy resin materials). A metal layer (e.g., copper or copper alloy) may be disposed on top surface (e.g., surface tb) of board 140 surrounding hole 162, sidewalls (e.g., sidewalls sw) of hole 162, and a bottom surface (e.g., surface tb) of board 140 surrounding hole 162. For example, metal layer 142 may be plated or deposited on surface bb of board 140, metal layer 144 may be plated or deposited on surface tb of board 140, and metal layer 146 may be plated or deposited on sidewalls sw of hole 162 in board 140. In example implementations, some of the metal layers disposed on board 140 may be attached to lead frame 130. For example, metal layer 142 on the bottom surface (e.g., surface tb) of board 140 surrounding hole 162 may be attached by a conductive layer (e.g., a solder or a conductive epoxy) to lead frame portion 130a (on a left-side L of hole 162) and lead frame portion 130b (on a right-side R of hole 162).

In example implementations, power module 100 may include several lead frames (e.g., lead frame 120 and lead frame 130) that can be connected to semiconductor device die 110 and extend out of the mold body as external terminals of the power module 100. Correspondingly, press-fit pin coupler 145/board 140 may include several plated-through holes (PTH) (e.g., hole 162) adapted to press-fit pins (e.g., press-fit pin 170, FIG. 1C) to form several signal leads or power leads of power module 100 electrically connected to the several lead frames. In some implementations, the several plated-through holes (PTH) (e.g., hole 162) may be aligned with corresponding cuts or openings (e.g., opening 132) in lead frame 130. FIG. 1B shows, for example, press-fit pin coupler 145/board 140 disposed in TMV 160 with several (e.g., three) plated-through holes (PTH) (e.g., hole 162) that are adapted to receive press-fit pins. Board 140 is disposed above lead frame 130 and hole 162 may be aligned with a cut, hole or opening (e.g., opening 132) in lead frame 130.

A press-fit pin (e.g., press-fit pin 170, FIG. 1C) inserted in hole 162 may form a signal lead or a power lead of power module 100. The press-fit pin 170 is electrically connected to lead frame 130 by the press-fit (i.e., mechanical contact) with metal layer 146 plated or deposited on sidewalls sw of hole 162 in board 140.

FIG. 1C shows, for example, a press-fit pin (e.g., press-fit pin 170) inserted in hole 162 of board 140 to form a signal lead or a power lead of power module 100. Press-fit pin 170 may, for example, be made of a metal or metal alloy (e.g., brass, copper, copper telluride, etc.). Press-fit pin 170 may, for example, be a double-sided press-fit pin with a first end 172 and a second end 174. The two ends (e.g., first end 172 and second end 174) may, for example, be structures that have a compressible width. For example, first end 172 may be an eye-of-a-needle style structure that has a (compressible) width W. Width W may be the same as (or slightly larger than) the diameter D of the plated-through holes (PTH) (e.g., hole 162). Insertion of first end 172 tightly in the slightly small hole (e.g., hole 162) can result in a press-fit (also known as interference fit or friction fit) fastening of press-fit pin 170 and metal layer 146 plated or deposited on sidewalls sw of hole 162 in board 140. This fastening of the first end 172 and metal layer 146, which is solder-less, may be achieved by normal force, friction, and cold welding of the surfaces in contact.

Figure 6:
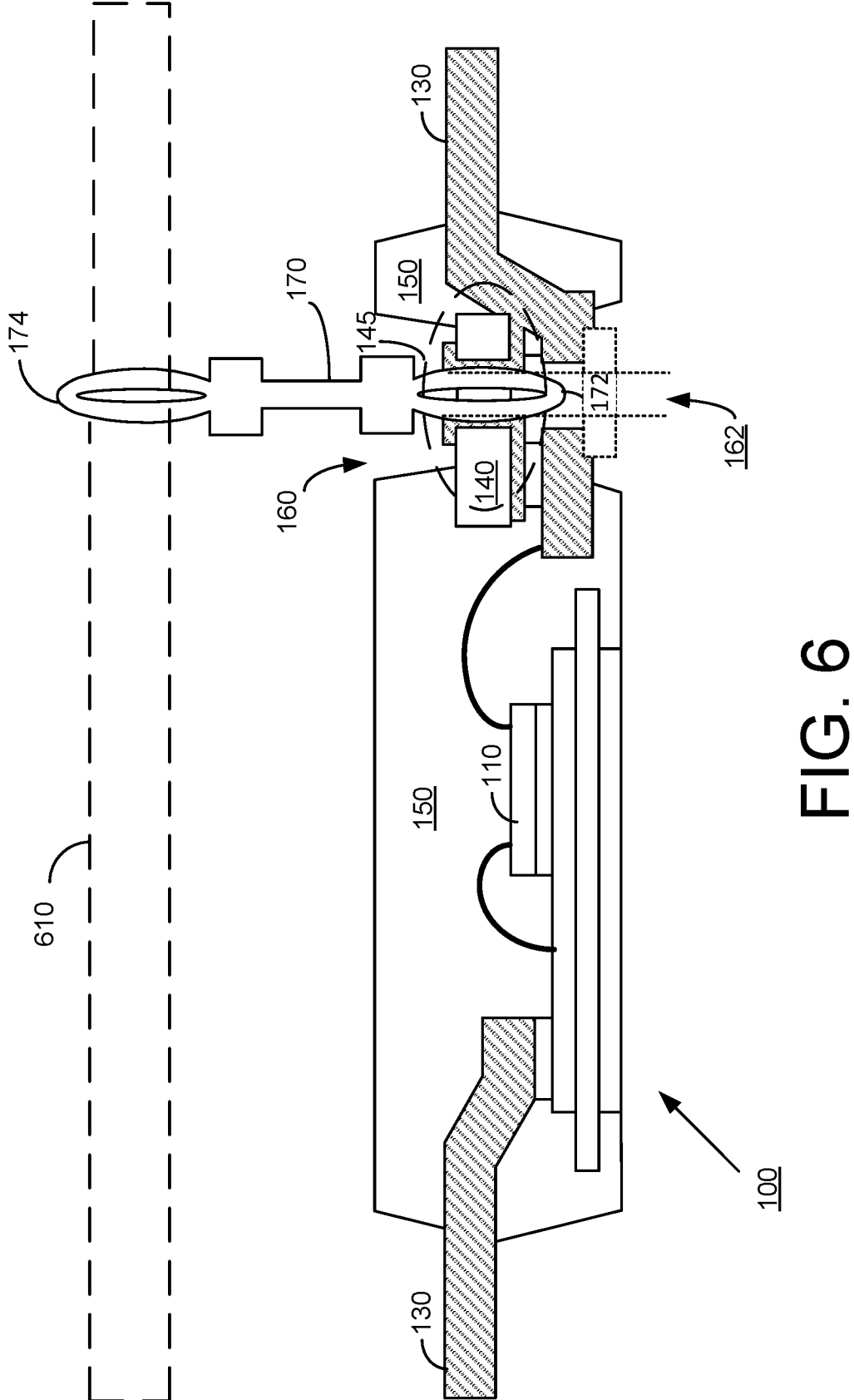
FIG. 6 schematically illustrates a power module attached to an external substrate.

In example implementations, the second ends (e.g., second end 174) of the press-fit pins (e.g., press-fit pin 170, FIG. 1C) may be used to mount (e.g., press-fit) power module 100 on a substrate (e.g., a printed circuit board) of a host electronics application (e.g., an automotive circuit application) (FIG. 6).

Figure 2B:
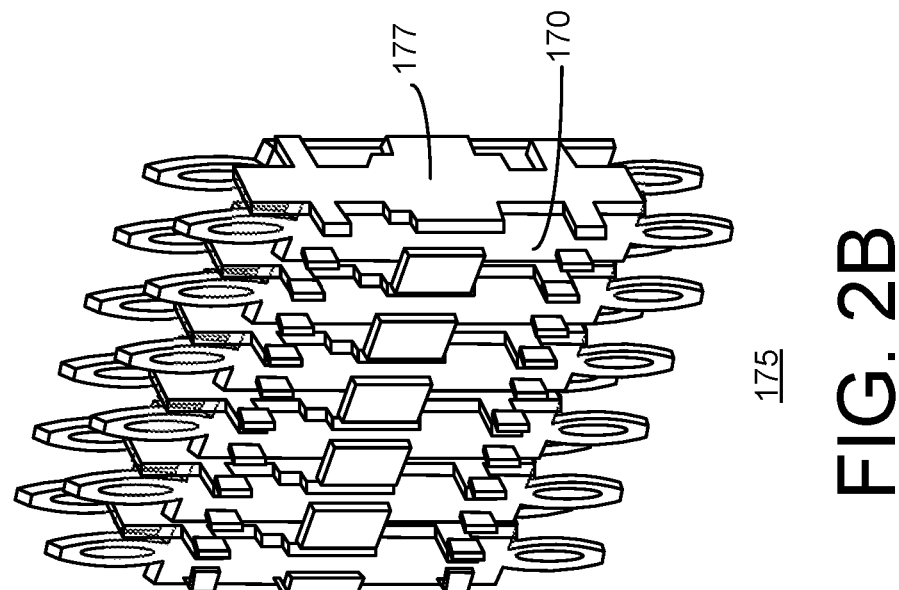
FIGS. 2A and 2B illustrate an individual press-fit pin and a set of press-fit pins in package, respectively.
Figure 2A:
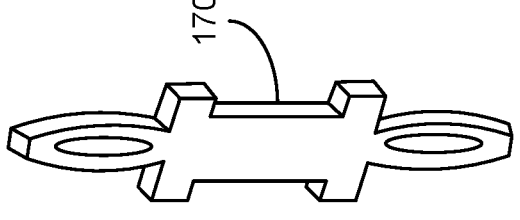

In some example implementations, the assembly of press-fit pins in press-fit pin coupler 145/board 140 may be accomplished inserting individual single pins (e.g., individual double-sided press-fit pins) one-by-one in the several plated-through holes (PTH) (e.g., hole 162) in board 140 (FIG. 1B). FIG. 2A shows, for example, an individual single press-fit pin (e.g., press-fit pin 170). In some other example implementations, the assembly of press-fit pins in press-fit pin coupler 145/board 140 may be accomplished by inserting multiple press-fit pins simultaneously in the several plated-through holes (PTH) (e.g., hole 162) in board 140. FIG. 2B shows, for example, a set of multiple press fit pins (e.g., press-fit pin 170) in a housing 175 that may be inserted simultaneously in the several plated-through holes (PTH) (e.g., hole 162) in board 140. In example implementations, housing 175 may be made of plastic (e.g., plastic 177).

FIG. 3 shows an example method 300 for assembling a power module with a press-fit pin as an external signal or power lead. Method 300A includes forming an assembly of power module components (310). The assembly of the power module components includes a semiconductor device die, at least a lead frame connected to the semiconductor device die, and a board (substrate) connected to the lead frame. The board (e.g., a PCB) may be made of resilient material. The board includes a plated-through hole (PTH). Method 300 further includes encapsulating the assembly in a mold body with a through-mold via (TMV) aligned with a portion of the board including the plated-through hole (PTH) (320). The PTH is not covered by mold material but is exposed to the environment (ambient) in the TMV and is physically accessible from outside the mold body through the TMV. Method 300 further includes press-fitting a press-fit pin in the PTH through the TMV (330). The press-fit pin (made of metal or a metal alloy) is electrically connected to the lead frame by the press-fitting and can form an external signal or power lead of the power module.

FIG. 4 shows an example method 400 for assembling a power module with press-fit pins as external signal or power leads.

Method 400 includes disposing a semiconductor power device on a first adhesive layer on a substrate (410) and disposing the substrate with the semiconductor power device on it on a jig (e.g., a soldering jig) (420). The power semiconductor power device may, for example, be an IGBT or a MOSFET device. The substrate may, for example, be a direct bonded copper (DBC) substrate, a direct bonded metal (DBM) substrate, an active metal brazed (AMB) substrate, an insulated metal substrate (IMS), or a ceramic substrate, etc. The first adhesive layer may, for example, be a solder material (e.g., a solder preform, solder paste, etc.).

Method 300 further includes disposing a first lead frame on a second adhesive layer on the substrate with the semiconductor power device disposed on the jig (430) and disposing a second lead frame on the jig (440). The second lead frame may include a cut or opening through it. Method 300 further includes disposing a board (e.g., a PCB substrate) on a third adhesive layer on the second lead frame (450). The board has a through hole (e.g., a plated-through hole (PTH)) in it. The board may have a metal layer deposited on a top surface, and a bottom surface, and on sidewalls of the through hole in the board. The board may be disposed on the second lead frame with the through hole aligned with the cut or opening in the second lead frame under the board.

Method 400 may further include applying heat to the assembly on the jig to reflow solder in the first, second and third adhesive layers (460). The solder reflow may bond the semiconductor device die to the substrate; the first lead frame to the substrate and the board with the through it to the second lead frame. The method may further include wire bonding the semiconductor device die to the substrate and to the second lead frame.

Method 400 may further include removing the assembly from the jig and placing the assembly to a molding cavity for encapsulation (470). The mold cavity may be shaped to encapsulate the assembly in a mold body with a through-mold via (TMV). A portion of the board including the plated-through hole (e.g., PTH) is aligned with the TMV so that PTH is accessible through the TMV (after removing the molded body from the molding cavity). Method 400 includes after encapsulating the assembly in a mold body with a through mold via (TMV), press-fitting a press-fit pin in a plated-through hole (PTH) in the board through the TMV (480). An example, press-fit pin may include a shaft with a first end. The first end may have dimensions for a press-fit (e.g., a friction or interference fit) when the first end is inserted in the plated-through hole (e.g., PTH). The press-fitted pin is electrically connected to the semiconductor power device in the power module by the press-fit and may form a signal lead or a power lead of the power module.

In example implementations, the press-fit pin may have a second end (distal end) on the shaft of the press-fit pin opposite the first end inserted in the plated-through hole. The second end may be coupled to a substrate (e.g., a PCB) of a host electronics application (e.g., an automotive application) that is supplied, for example, with power by the power module.

FIGS. 5A through 5G schematically illustrate a power module (e.g., power module 100) having press-fit signal or power leads at different stages of construction or after the different steps of method 400 for fabricating the power module. FIGS. 5A through 5G show cross-sectional views of the optical sensor package at the different stages of construction.

Figures 5A, 5B:
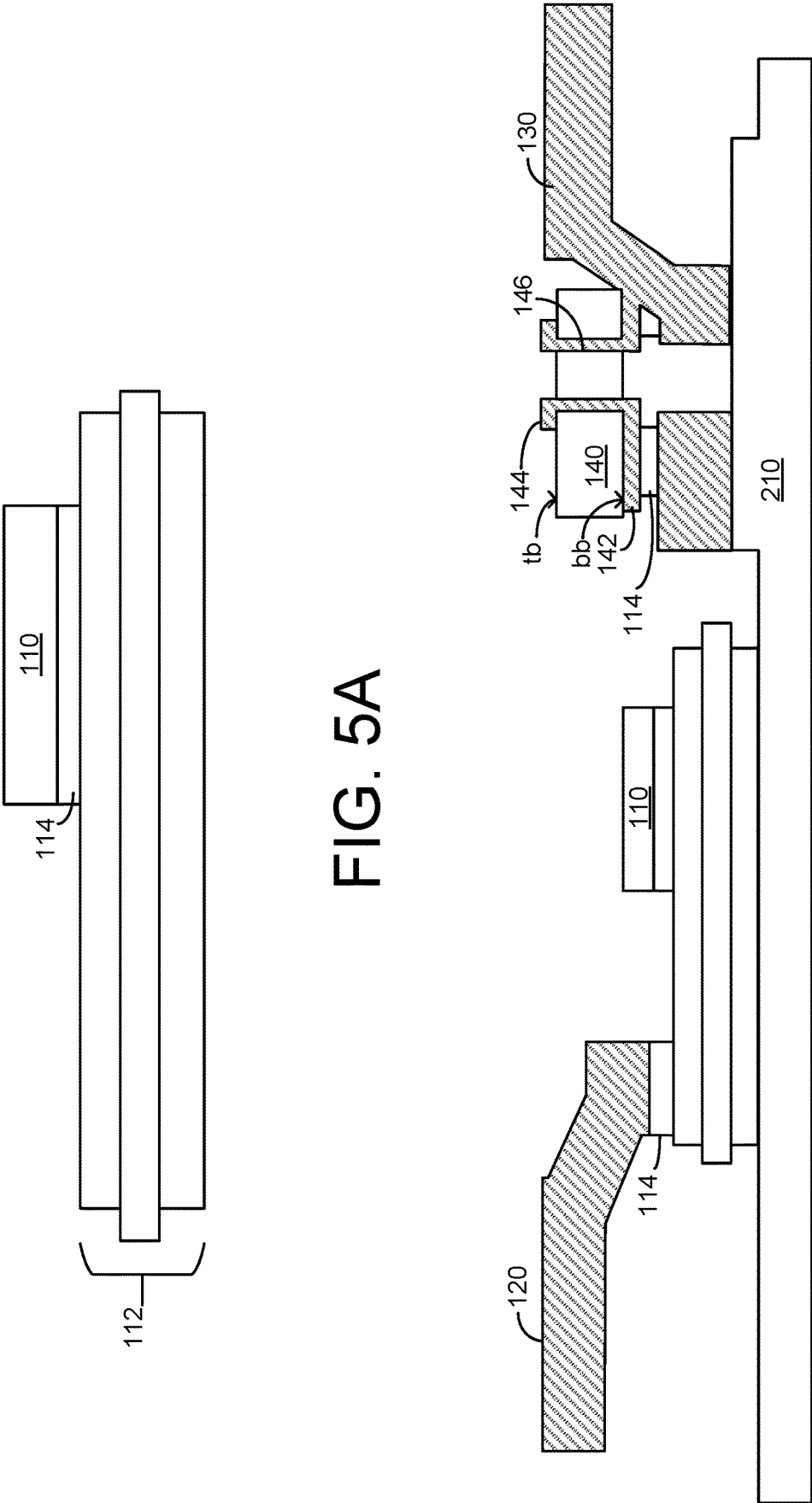
FIGS. 5A through 5G schematically illustrate a power module at different stages of construction.

FIG. 5A shows an example semiconductor device die 110 disposed on a substrate 112 (e.g., a DBM substrate) at a first stage of construction. Semiconductor device die 110 may be placed on an adhesive layer (e.g., first adhesive layer 114) (e.g., a solder preform, or solder paste, etc.) disposed on substrate 112.

FIG. 5B shows, at a second stage of construction, substrate 112 with the semiconductor device die disposed thereon, lead frames (e.g., lead frame 120, lead frame 130), and board 140 with at least one plated-through hole (PTH) (e.g., hole 162) through it, are placed on a jig 210 (e.g., a soldering jig). Lead frame 120 may be placed on an adhesive layer (e.g., a second adhesive layer 114) (e.g., a solder) on substrate 112. Board 140 may include at least one plated-through hole (e.g., hole 162). Board 140 may further include metal layers (e.g., metal layer 142, metal layer 144) disposed on a top surface tb and a bottom surface bb of board 140, and metal layer 146 disposed on sidewalls (e.g., sidewalls sw) of hole 162. The bottom surface metal layer (e.g., metal layer 144) of board 140 is placed on an adhesive layer (e.g., layer 114) (e.g., a solder preform, or solder paste, etc.) disposed on lead frame 130.

Figure 5C:
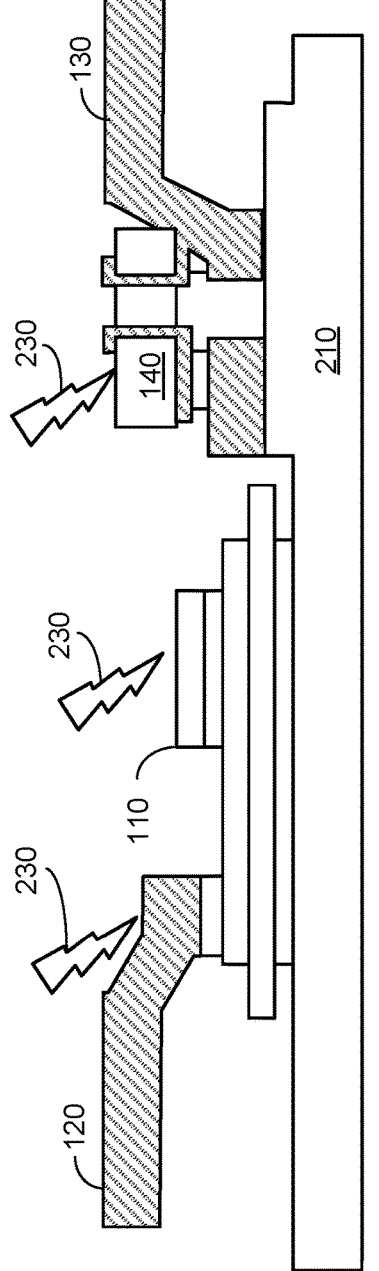

FIG. 5C shows, at a third stage of construction, heat (heat 230) may be applied to the assembly for solder reflow of the various adhesive layers (e.g., the first adhesive layer 114 between semiconductor device die 110 and substrate 112, the second adhesive layer 114 between substrate 112 and lead frame 120, and the third adhesive layer 114 between lead frame 130 and board 140).

Figure 5D:
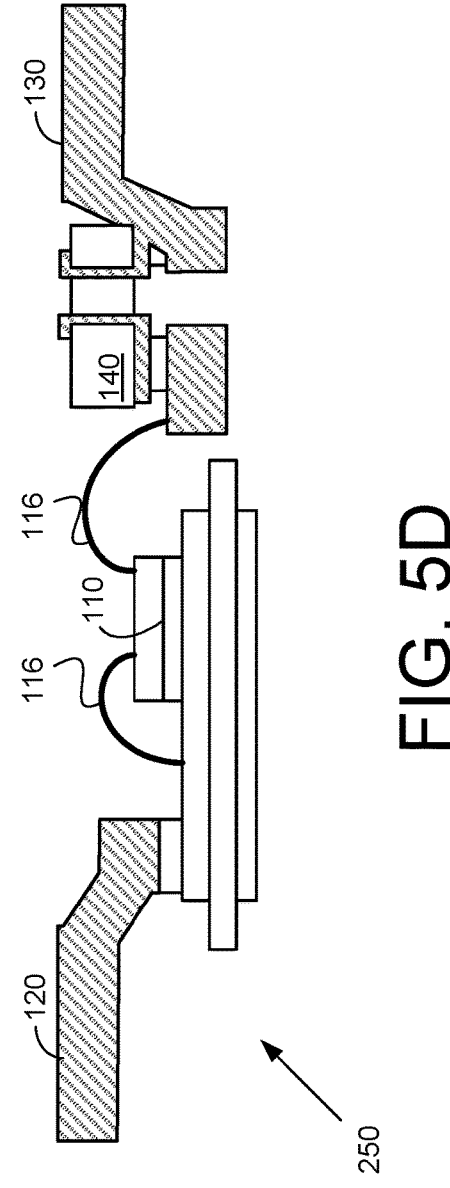

Further, wire bonds (wire bond 116) can be made connecting semiconductor device die 110 to substrate 112 and lead frame 130. At a fourth stage of construction, as shown in FIG. 5D, the jig 210 (e.g., the soldering jig) may be removed to release an assembly (e.g., an unmolded assembly 250) including semiconductor device die 110 attached (soldered) to substrate 112, substrate 112 attached (soldered) to lead frame 120, and board 140 attached (soldered) to lead frame 130.

Figure 5E:
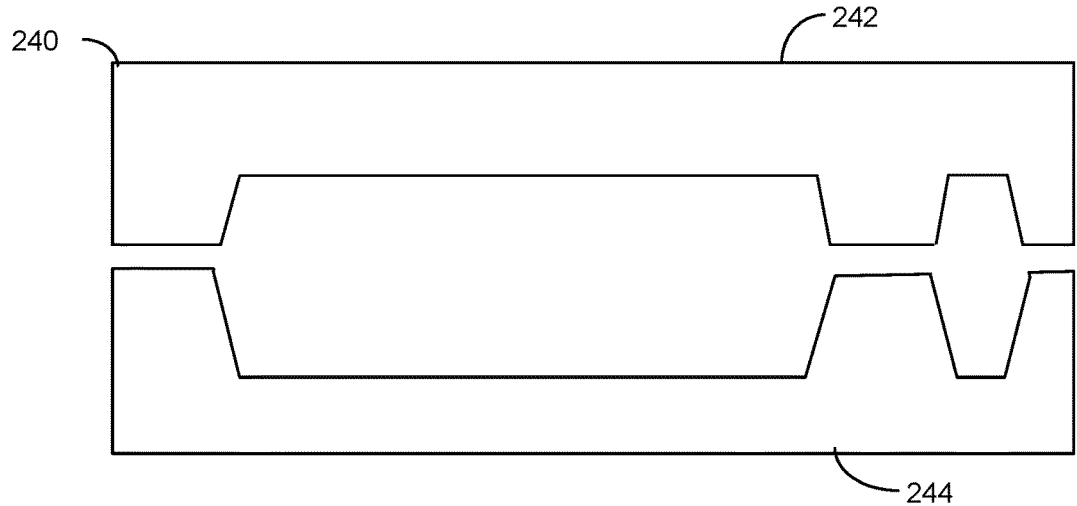

At a fifth stage of construction, the unmolded assembly 250 is placed in a mold cavity (e.g., mold cavity 240). As shown in FIG. 5E, mold cavity 240 may, for example, have a clam-shell form including a cavity top form 242 and a cavity bottom form 244 to enclose portions the unmolded assembly 250. Mold cavity 240 may have a shape that forms a mold body (e.g., mold body 150) that includes a through mold via (e.g., TMV 160) aligned with the at least one plated-through hole (e.g., hole 162) in board 40 and opening 132 in lead frame 130.

Figure 5F:
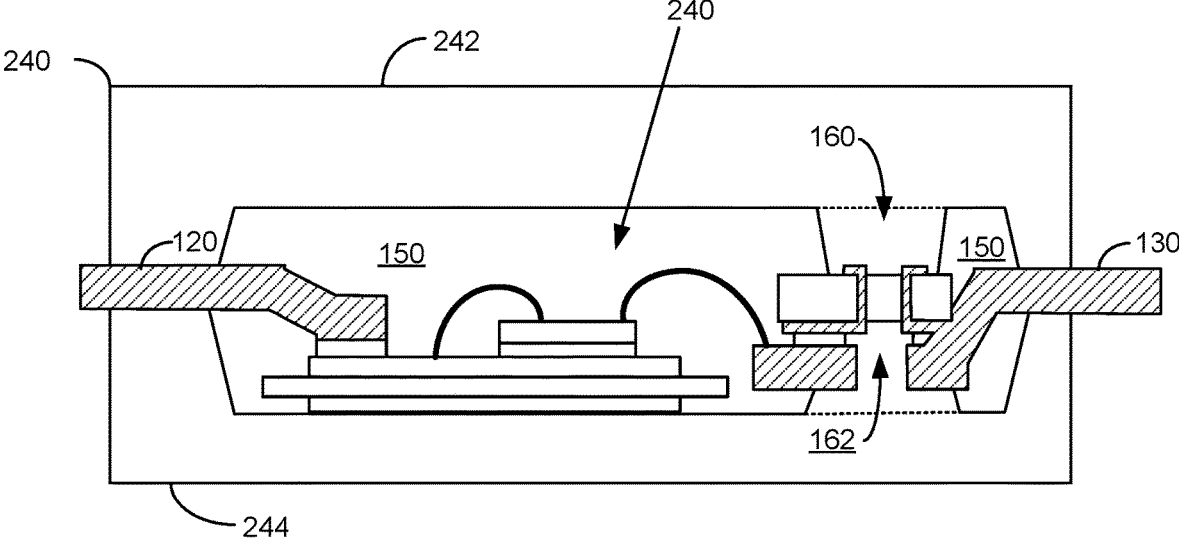

FIG. 5F shows the unmolded assembly 250 placed and encapsulated in mold body 150 in mold cavity 240.

Figure 5G:
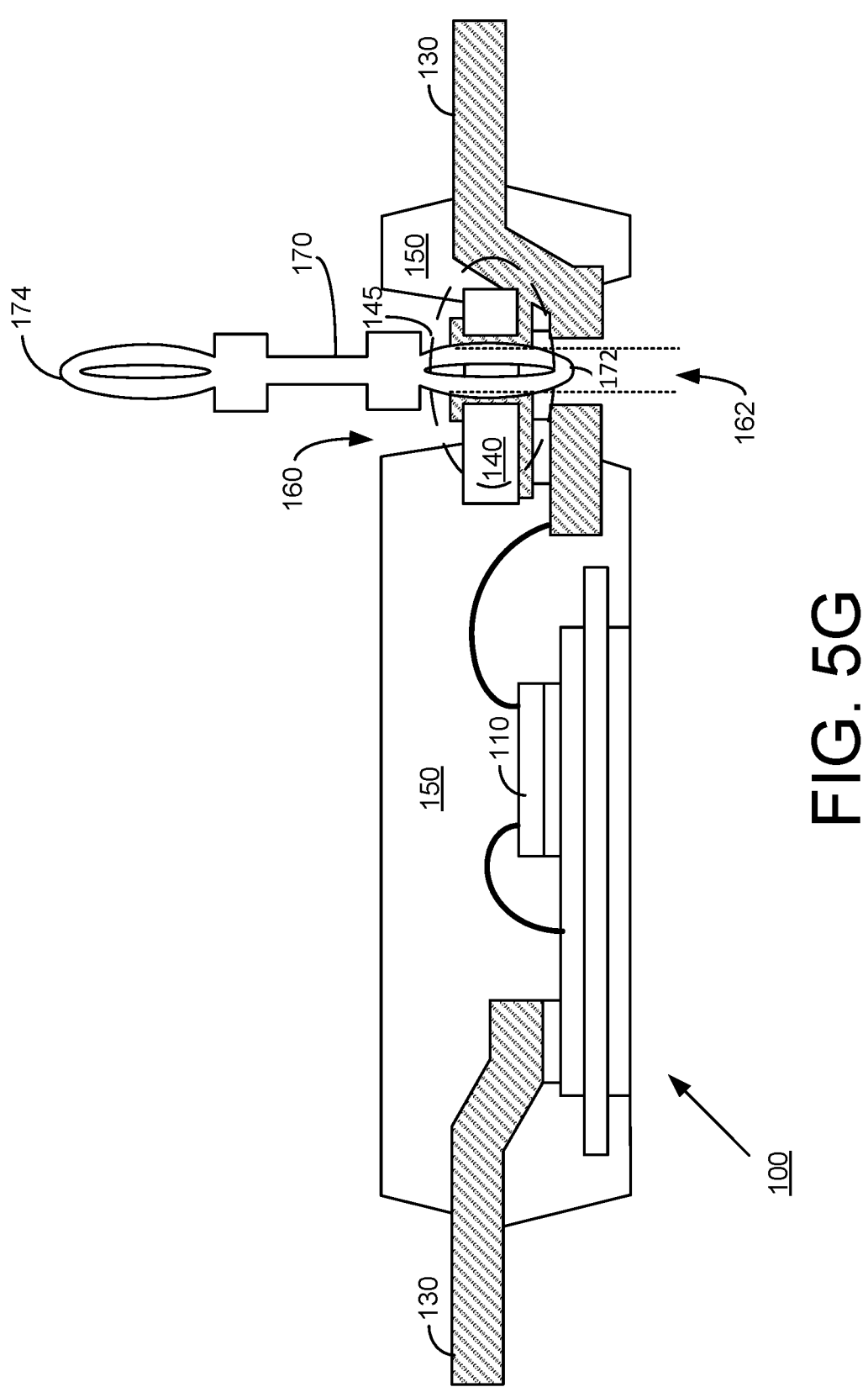

At a sixth stage of construction, as shown in FIG. 5G, the molded assembly (e.g., power module 100 encapsulated in mold body 150) may be taken out of mold cavity 240. Power module 100 encapsulated in mold body 150 includes press-fit pin coupler 145/board 140 having PTHs (e.g., hole 162) adapted to receive press-fit pins for signal or power leads. As shown in FIG. 5G, for example, a press-fit pin 170 can be inserted in hole 162 of board 140 to form a signal lead or a power lead of power module 100.

Figure 5H:
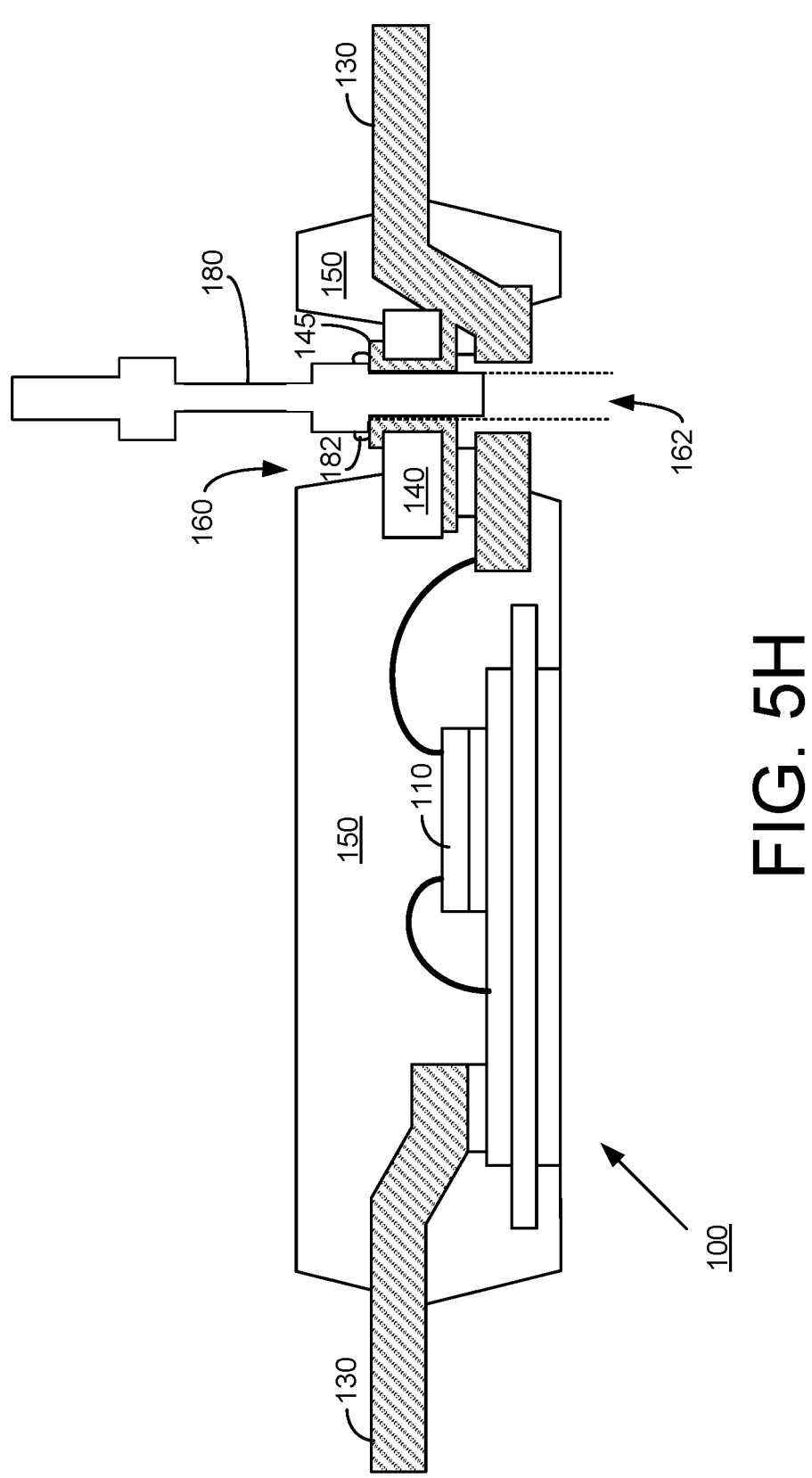
FIG. 5H illustrates an example pin disposed in a through mold via (TMV) to form a signal lead or a power lead of a power module.

In some example implementations, a pin may be disposed in the TMV and attached to a portion of the substrate lead frame in the TMV using one of a solder, an adhesive or an interference fit. FIG. 5H shows, for example, an example pin 180 disposed in TMV 160 and connected to the substrate lead frame (via board 140) to form a signal lead or a power lead of power module 100. Pin 180 may not be a press-fit pin. Pin 180 may be attached to board 140, for example, using, an adhesive or solder (e.g., solder 182) or by an interference fit in hole 162.

In example implementations, power module 100 with the press-fit pins (e.g., pin 170) may be coupled to an external substrate (e.g., a printed circuit board (PCB) of a host power electronics circuit. FIG. 6 schematically illustrates power module 100 attached to an external substrate (e.g., PCB 610). In power module 100, the first end (e.g., first end 172) of press-fit pin (170 is coupled to the power module in press-fit pin coupler 145. The second end (e.g., second end 174) of press-fit pin 170 may be press-fit in a socket (not shown) or a plated-through hole (not shown) or soldered to a trace (not shown) in PCB 610.

It will be understood, for purposes of this disclosure, that when an element, such as a layer, a region, or a substrate, is referred to as being on, disposed on, disposed in, connected to, electrically connected to, coupled to, or electrically coupled to another element, it may be directly on, connected or coupled to the other element, or one or more intervening elements may be present. In contrast, when an element is referred to as being directly on, directly disposed on, directly disposed in, directly connected to, or directly coupled to another element or layer, there are no intervening elements or layers present. Although the terms directly on, direct in, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A module comprising:
an assembly including a semiconductor device die, a lead frame connected to the semiconductor device die, and a substrate connected to the lead frame, the substrate including at least one plated-through hole (PTH); and
a mold body encapsulating the assembly, the mold body including a through-mold via (TMV) aligned with a portion of the substrate including the at least one PTH, the PTH being exposed in the TMV to an environment outside the mold body and being physically accessible from outside the mold body through the TMV.

2. The module of claim 1, further comprising:
a pin having an end that is press fitted in the at least one PTH through the TMV outside the mold body.

3. The module of claim 2, wherein the end of the pin has an eye-of-a-needle style structure.

4. The module of claim 2, wherein the end is a first end of the pin, and wherein a second end of the pin is coupled to an external substrate.

5. The module of claim 1, wherein the substrate is a printed circuit board (PCB).

6. The module of claim 1, wherein the semiconductor device die includes at least one of an insulated-gate bipolar transistor (IGBT) and a metal-oxide-semiconductor field-effect transistor (MOSFET).

7. The module of claim 1, wherein the semiconductor device die is disposed on a direct bonded metal (DBM) substrate, and wherein the assembly includes a wire bond between the semiconductor device die and the DBM substrate.

8. The module of claim 1, wherein the assembly includes a wire bond between the semiconductor device die and the lead frame.

9. The module of claim 1, wherein the mold body encapsulating the assembly is made of an epoxy molding compound (EMC).

10. The module of claim 1, further comprising:
a pin disposed in the TMV and attached to the lead frame in the TMV using one of a solder, an adhesive or an interference fit.

11. A module comprising:
a power device encapsulated in a mold body; and
a press-fit pin coupler disposed outside the mold body in a through-mold via (TMV), the press-fit pin coupler being physically accessible from outside the mold body through the TMV, the press-fit pin coupler being electrically connected to the power device encapsulated in the mold body.

12. The module of claim 11, further comprising: a pin that is coupled to the press-fit pin coupler outside the mold body.

13. The module of claim 12, wherein the press-fit pin coupler includes a substrate having a plated-through hole (PTH), a portion of the substrate including the PTH being disposed outside the mold body in TMV, the PTH being physically accessible from outside the mold body through the TMV.

14. The module of claim 13 further comprising:
a pin that is press fitted in the PTH, the pin having an end with an eye-of-a-needle style structure.

15. The module of claim 14, wherein the pin that is press fitted in the PTH is a double-sided press-fit pin.

16. The module of claim 11, wherein the power device includes at least one of an insulated-gate bipolar transistor (IGBT) and a metal-oxide-semiconductor field-effect transistor (MOSFET).

17. A method comprising:
forming an assembly including a semiconductor device die, at least a lead frame connected to the semiconductor device die, and a substrate connected to the lead frame, the substrate including at least one plated-through hole (PTH); and
encapsulating the assembly in a mold body with a through-mold via (TMV) aligned with a portion of the substrate including the at least one plated-through hole (PTH), the PTH being exposed in the TMV to an environment outside the mold body and being physically accessible from outside the mold body through the TMV.

18. The method of claim 17, further comprising:
press fitting an end of a pin in the at least one PTH through the TMV.

19. The method of claim 18, wherein the end of the pin is a first end of the pin, the method further comprising coupling a second end of the pin to an external substrate.

20. The method of claim 17, wherein the substrate is a printed circuit board (PCB).

21. The method of claim 17, wherein the semiconductor device die includes at least one of an insulated-gate bipolar transistor (IGBT) and a metal-oxide-semiconductor field-effect transistor (MOSFET).

* * * * *